United States Patent
Fan

(10) Patent No.: US 7,692,313 B2
(45) Date of Patent: Apr. 6, 2010

(54) SUBSTRATE AND SEMICONDUCTOR PACKAGE FOR LESSENING WARPAGE

(75) Inventor: Wen-Jeng Fan, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 198 days.

(21) Appl. No.: 12/042,105

(22) Filed: Mar. 4, 2008

(65) Prior Publication Data

US 2009/0224397 A1    Sep. 10, 2009

(51) Int. Cl.
*H01L 23/48* (2006.01)

(52) U.S. Cl. ............... 257/779; 257/E23.015; 257/E23.02

(58) Field of Classification Search .......... 257/737, 257/753, 778, 784, 787, 779, E23.015, E23.02; 438/108

See application file for complete search history.

(56) References Cited

U.S. PATENT DOCUMENTS 7,528,476 B2 *    5/2009   Ito ....................... 257/689
2007/0080466 A1 *   4/2007  Chou et al. ............. 257/777

* cited by examiner

*Primary Examiner*—Quoc D Hoang
(74) *Attorney, Agent, or Firm*—Muncy, Geissler, Olds & Lowe, PLLC

(57) ABSTRACT

A substrate with reduced substrate warpage and a semiconductor package utilizing the substrate are revealed. The substrate primarily comprises a core where a wiring layer and a first solder mask are formed on one surface of the core, and a second solder mask and a die-attaching layer are formed on the other surface of the core. The first solder mask has a thickness difference with respect to the second solder mask in a manner to reduce the warpage of the substrate caused by thermal stresses due to temperature differences can be well under control. Therefore, the manufacturing cost of the substrate can be lower without adding extra stiffeners to achieve substrate warpage control during semiconductor packaging processes.

16 Claims, 3 Drawing Sheets

SUBSTRATE AND SEMICONDUCTOR PACKAGE FOR LESSENING WARPAGE

FIELD OF THE INVENTION

The present invention relates to a printed circuit board for semiconductor packages, especially to a substrate with reduced substrate warpage and a semiconductor package utilizing the substrate.

BACKGROUND OF THE INVENTION

Recently, printed circuit boards as chip carriers for semiconductor packages have developed toward substrates with higher density, higher performance, and smaller form factor. In conventional semiconductor packaging processes, substrates have to be pre-baked before disposing die-attaching materials. Since substrates will experience different thermal heat treatments during semiconductor packaging processes such as post cure of die-attaching materials, reflow of solder bumps, or curing of molding compound, substrates will be easily warpaged due to CTE, Coefficient of Thermal Expansion, mismatched between substrates and other packaging materials utilized in semiconductor packages leading to handling issues during semiconductor packaging processes.

As shown in FIG. 1, a substrate 100 for a conventional semiconductor package is formed by lamination, normally comprising a core 110, a first solder mask 120, a second solder mask 130, a first wiring layer 140, and a second wiring layer 160. The core 110 is a reinforced glass fiber mixed with resins and is used as the base of the substrate 100. Symmetrically, a first wiring layer 140 is laminated on the bottom surface of the core 110 and a second wiring layer 160 is laminated on the top surface of the core 110. The wiring layers 140 and 160 are made of copper to form a plurality of conductive traces. To be more symmetrical, a first solder mask 120 and the second solder mask 130 are disposed on the bottom surface and the top surface of the substrate 100, respectively where the thicknesses of the solder masks 120 and 130 are the same. The solder masks 120 and 130 are dielectric materials to cover and protect the conductive traces with a plurality of external pads 141 and a plurality of bonding fingers 161 exposed as electrical terminals for connecting solder balls and for wire bonding, respectively. Since the conventional substrate 100 has a plurality of symmetrical laminated layers, therefore, the substrate warpage is minor during semiconductor packaging processes.

As shown in FIG. 1, during semiconductor packaging processes, an electronic device such as a semiconductor chip 11 is disposed on the top surface of the substrate 100 by a die-attaching material 12. The chip 11 has a plurality of bonding pads 11A which are disposed on its active surface and are electrically connected to the bonding fingers 161 of the substrate 100 by a plurality of electrical connecting components 13 such as bonding wires. Then, an encapsulant 14 formed by transfer molding or by dispensing is disposed on the top surface of the substrate 100 to encapsulate the chip 11 and the electrical connecting components 13 to provide better protections. Then, a plurality of external terminals 15, normally solder balls, are disposed on the bottom surface of the substrate 100 to form a BGA semiconductor package.

However, during semiconductor packaging processes such as disposing of die-attaching materials, curing of molding compound, placing of external terminals, or thermal cycle testes, substrates 100 will experience thermal heat treatments leading to substrate warpage issues, especially pre-forming the die-attaching materials 12 on the substrate 100. If the CTE of the die-attaching material 12 is different from the one of the substrate 100 or from the ones of the other packaging materials, or the die-attaching materials 12 has a larger curing shrinkage, the substrate 100 will experience unbalanced thermal stresses causing substrate warpage leading to handling issues during semiconductor packaging processes.

SUMMARY OF THE INVENTION

The main purpose of the present invention is to provide a substrate with reduced substrate warpage and a semiconductor packages utilizing the substrate. By changing thicknesses of solder masks on the top surface and on the bottom surface of the substrate, the thermal stresses due to temperature differences are balanced to reduce substrate warpage. Therefore, the manufacturing cost of the substrate can be decreased without adding extra stiffeners to control substrate warpage.

According to the present invention, a substrate comprises a core, a first solder mask, a second solder mask, a first wiring layer, and a die-attaching layer. The core has a first surface and a second surface. The first solder mask is formed on the first surface of the core and the second solder mask is formed on the second surface of the core. The first wiring layer is formed on the first surface of the core and is partially covered by the first solder mask. The die-attaching layer is formed on the second solder mask where the first solder mask has a thickness difference with respect to the second solder mask in a manner to reduce the warpage of the substrate.

DETAIL DESCRIPTION OF THE INVENTION

Please refer to the attached drawings, the present invention will be described by means of embodiments below.

Figure 1:
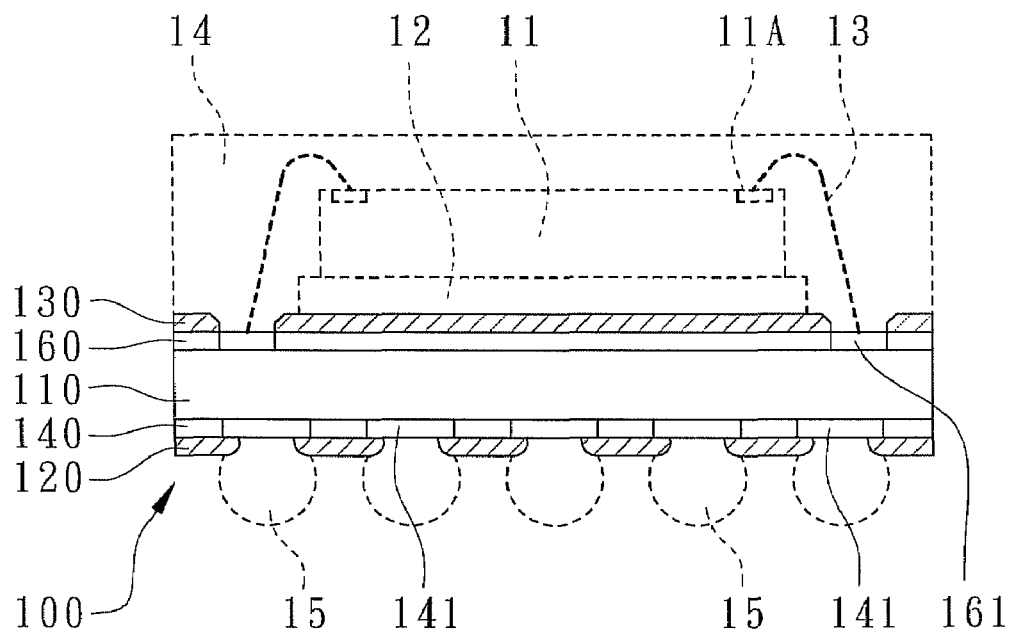
FIG. 1 shows a cross-sectional view of a conventional substrate for a semiconductor package.
Figure 2:
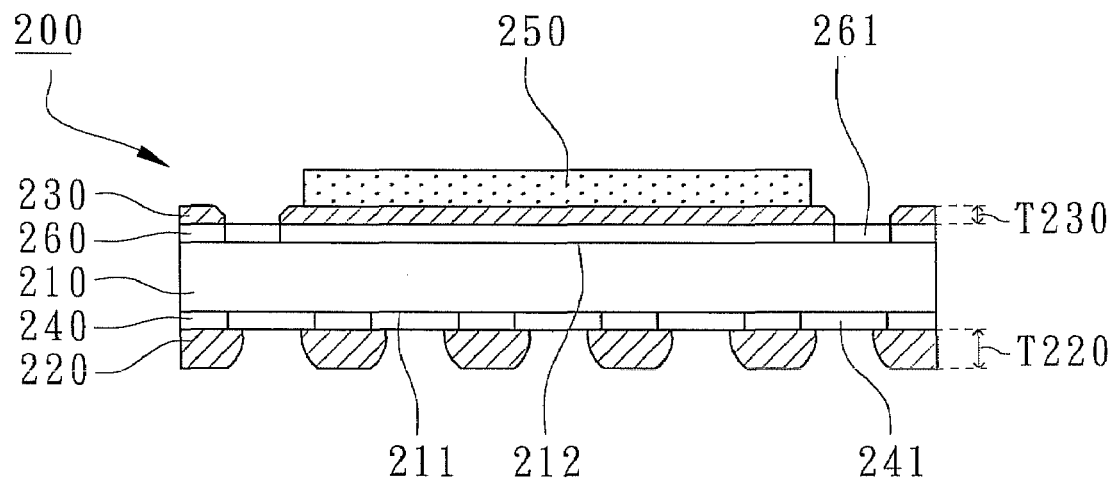
FIG. 2 shows a cross-sectional view of a substrate with reduced substrate warpage according to the first embodiment of the present invention.

As shown in FIG. 2, a substrate 200 primarily comprises a core 210, a first solder mask 220, a second solder mask 230, a first wiring layer 240, and a die-attaching layer 250. The core 210 has a first surface 211 and a second surface 212. The core 210 is the middle base layer of the substrate 200 made of reinforced glass fibers with resins where the resins can be epoxy resin, PI (Polyimide), BT (Bismaleimide Trazine), FR4 resins, etc. The first solder mask 220 is formed on the first surface 211 of the core 210 and the second solder mask 230 is formed on the second surface 212 of the core 210. The solder masks 220 and 230 are also called "solder resist" where green dyes were added into the solder masks to enhance visual inspection. The solder masks 220 and 230 are composed of epoxy resins and photosensitive resins and are printed on the surfaces of a printed circuit board to form a protection layer to keep circuits from external contamination of moisture, particles, and others foreign materials. However, the color of the solder masks 220 and 230 are not limited to green. They can be black, red, blue, or any other colors. Solder masks are coated by screen printing, curtain printing, spray coating, and roller coating. Alternatively, the solder masks 220 and 230 can be formed by lamination of an epoxy resin film or by coating and curing an epoxy resin liquid, especially, the first solder mask 220 has a thickness difference with respect to the second solder mask 230 in a manner to reduce the warpage of the substrate. To be more specific, the thickness difference between the first solder mask 220 and the second solder mask 230 is larger than 10 μm to reduce substrate warpage of the substrate 200 due to thermal stresses exerted on the first solder mask 220 and on the second solder mask 230.

Furthermore, the first wiring layer 240 is formed on the first surface 211 of the core 210 and is covered by the first solder mask 220. The first wiring layer 240 is made of copper and is formed by pattern etching to pattern a plurality of conductive traces. To be more specific, in the present embodiment, the substrate 200 further comprises a second wiring layer 260 which is formed on the second surface 212 of the core 210 and is covered by the second solder mask 230 so that the substrate 200 is a laminated substrate.

The die-attaching layer 250 is formed on the second solder mask 230 for die attachment. In this embodiment, the die-attaching layer 250 partially covers a central area of the second solder mask 230. Preferably, the die-attaching layer 250 can be chosen from B-stage paste or other multiple-stage curable die-attaching materials. In different embodiment, the die-attaching material 250 can be chosen from non-B-stage adhesive tapes or sticky paste. The die-attaching material 250 can be pre-formed on the substrate 200 before semiconductor packaging processes.

Figure 3:
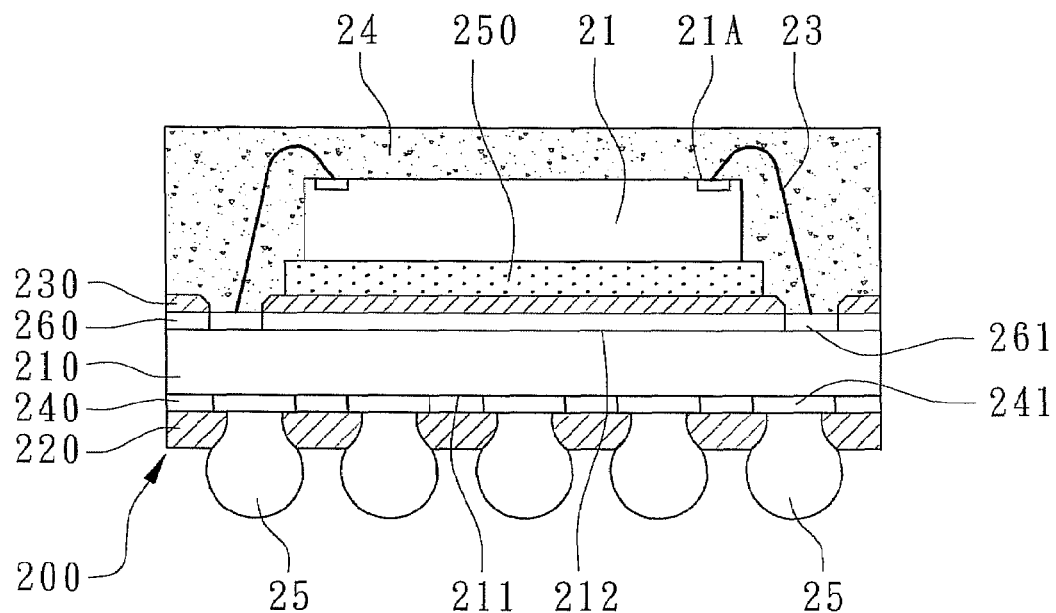
FIG. 3 shows a cross-sectional view of a semiconductor package using the substrate according to the first embodiment of the present invention.

Accordingly, the substrate warpage due to CTE mismatch between different packaging materials such as chip, substrate, solder balls, die-attaching layer, and encapsulant can be compensated by the thickness difference between the first solder mask 220 and the second solder mask 230 to achieve balanced thermal stresses. As shown in FIG. 2, in the present embodiment, the die-attaching layer 250 has about the same CTE as the one of the first solder mask 220. Preferably, as shown in FIG. 2, the thickness T220 of the first solder mask 220 is larger than the thickness T230 of the second solder mask 230. As shown in FIG. 3, since the first solder mask 220 is formed on an external surface of the substrate 200 connected with the external terminals 25, the adjusted thickness of the first solder mask 220 will not affect the overall thickness of the semiconductor package. Furthermore, the thickness differences between the first solder mask 220 and the second solder mask 230 can be simulated and determined by ANSYS simulation software through finite element method, FEM. The thicknesses and CTE of the die-attaching layer 250, the first solder mask 220, and the second solder mask 230 can be appropriately adjusted to balance the thermal stresses on the top surface and on the bottom surface of the substrate 200 to reduce the substrate warpage of the substrate 200 during semiconductor packaging processes. Normally, the CTE of the solder mask ranges between 60 to 160 ppm/° C., the CTE of the core and the CTE of the circuits are about 16 ppm/° C.

To be more specific, the first wiring layer 240 includes a plurality of external pads 241 where the first solder mask 220 has a plurality of openings to expose the external pads 241. Additionally, the second solder mask 230 also have a plurality of openings to expose a plurality of bonding fingers 261 of the second wiring layer 260.

In the following packaging processes as shown in FIG. 3, a semiconductor chip 21 is disposed on the second surface 212 of the core 210 by the die-attaching layer 250 adhering the back surface of the semiconductor chip 21 to the second solder mask 230. The chip 21 has a plurality of bonding pads 21A disposed on its active surface. The chip 21 is electrically connected to the substrate 200 by a plurality of electrical connecting components 23 connecting from the bonding pads 21A of the chip 21 to the bonding fingers 261 of the first wiring layer 240 on the substrate 200. In the present embodiment, the electrical connecting components 23 are bonding wires formed by wire bonding. Then, an encapsulant 24 is disposed above the second surface 212 of the core 210 to encapsulate the chip 21 and the electrical connecting components 23 by transfer molding or by dispensing to provide better protections. In this embodiment, the encapsulant 24 covers the other area of the second solder mask 230 since the die-attaching layer 250 only partially covers a central area of the second solder mask 230. A plurality of external terminals 25 are disposed on the first surface 211 of the substrate 200 for electrical connections to external printed circuit boards. In the present embodiment, the external terminals 25 include a plurality of solder balls. Generally, the thickness of the second solder mask 230 is normal but the thickness of the first solder mask 220 is adjustable to become thicker. It is advantageous that the thickness difference between the first solder mask 220 and the second solder mask 230 doesn't altered the package thickness of the semiconductor package as shown FIG. 3 whenever the first solder mask 220 is thick or thin, however, the substrate warpage is improved During substrate baking, molding compound curing, or thermal cycle tests, since the thickness T220 of the first solder mask 220 is larger than the thickness T230 of the second solder mask 230, moreover, the die-attaching layer 250 has about the same CTE as the one of the first solder mask 220, therefore, no matter the substrate 200 is under heating or cooling conditions, the thickness differences of the first solder mask 220 can provide stress compensation for substrate warpage so that the warpage of the substrate 200 is stable and under control and will not be affected by temperature differences.

Figure 4:
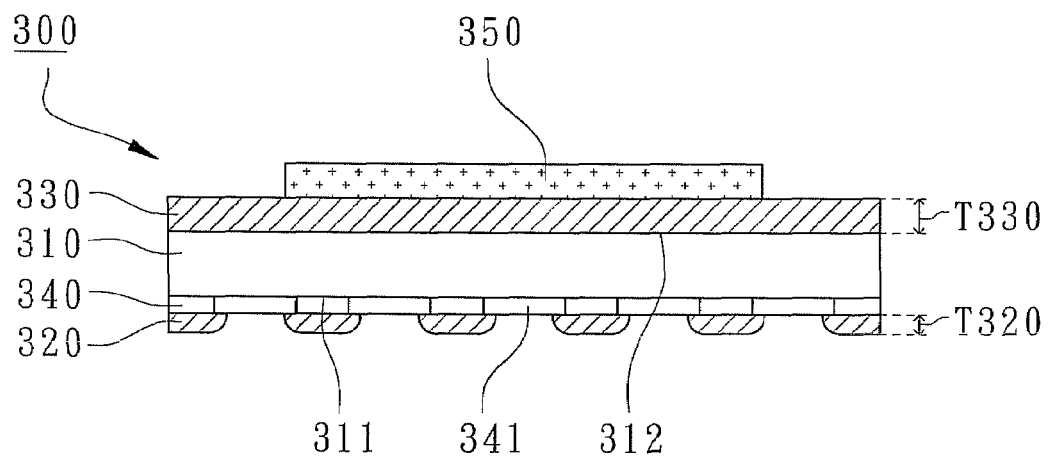
FIG. 4 shows a cross-sectional view of a substrate according to the second embodiment of the present invention.

In the second embodiment of the present invention, another substrate 300 is disclosed as shown in FIG. 4, comprising a core 310, a first solder mask 320, a second solder mask 330, a first wiring layer 340, and a die-attaching layer 350. The core 310 has a first surface 311 and a second surface 312. The first solder mask 320 is formed on the first surface 311 of the core 310 and the second solder mask 330 is formed on the second surface 312 of the core 310. The first wiring layer 340 is formed on the first surface 311 of the core 310 and is partially covered by the first solder mask 320. The die-attaching layer 350 is formed on the second solder mask 330 for die attachment, which has a smaller covering area than the one of the second solder mask 330. The first solder mask 320 has a thickness difference with respect to the second solder mask 330 in a manner to reduce the warpage of the substrate 300. As shown in FIG. 4, in this embodiment, in the present embodiment, the thickness T320 of the first solder mask 320 is smaller than the thickness T330 of the second solder mask 330. Normally, the CTE of the die-attaching layer 350 is smaller than the one of the first solder mask 320. Since the substrate 320 has only one circuit, therefore, by increasing the thickness T330 of the second solder mask 330 to balance the thermal stresses on the top surface and on the bottom surface of the substrate 300 to reduce the substrate warpage of the substrate 300.

Figure 5:
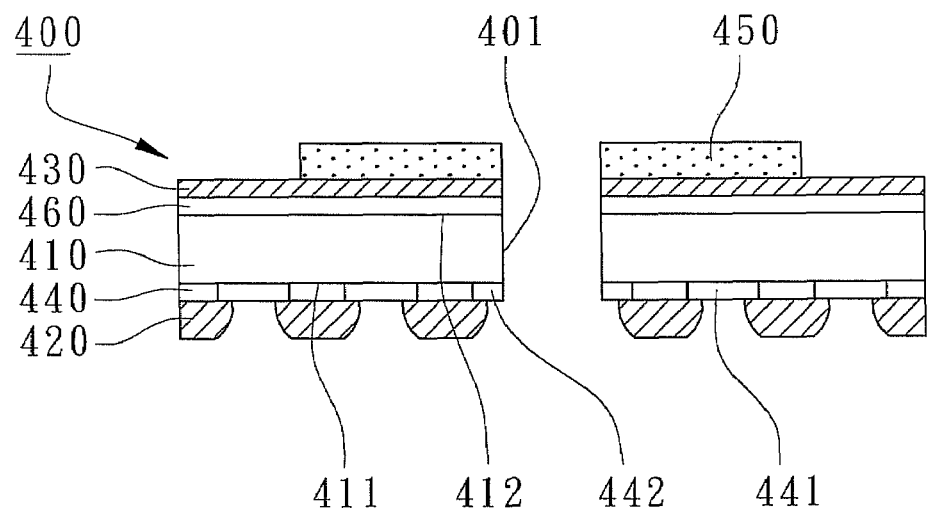
FIG. 5 shows a cross-sectional view of a substrate according to the third embodiment of the present invention.

The third embodiment of the present invention, another substrate 400 with reduced substrate warpage and the corresponding semiconductor package are revealed. As shown in FIG. 5, the substrate 400 primarily comprises a core 410, a first solder mask 420, a second solder mask 430, a first wiring layer 440, a die-attaching layer 450 and a metal layer 460. The core 410 has a first surface 411 and a second surface 412. The first solder mask 420 is formed on the first surface 411 of the core 410 and the second solder mask 430 is formed on the second surface 412 of the core 410. The first wiring layer 440 is formed on the first surface 411 of the core 410 and is partially covered by the first solder mask 420. The die-attaching layer 450 is formed on the second solder mask 430 for die attachment. The metal layer 460 is interposed between the core 410 and the second solder mask 430 as a ground layer. Specifically, the first solder mask 420 has a thickness difference with respect to the second solder mask 430 in a manner to reduce the warpage of the substrate 400. As shown in FIG. 5, in the present embodiment, the substrate 400 has a through hole 401 penetrating through the first solder mask 420, the core 410, and the second solder mask 430 for passing the bonding wires. In this embodiment, the through hole 410 is a slot which can be disposed at the center of the substrate or other locations. As shown in FIG. 5, the thickness of the first solder mask 420 is larger than the one of the second solder mask 430. The CTE (Coefficient of Thermal Expansion) of the die-attaching layer 450 may be about the same as the one of the first solder mask 420 to decrease the thermal stresses between the first solder mask 420 and the second solder mask 430 for better control of substrate warpage.

To be more specific, the first wiring layer 440 includes a plurality of external pads 441 and a plurality of bonding fingers 442. The first solder mask 420 has a plurality of openings to expose the external pads 441 and the bonding fingers 442.

Figure 6:
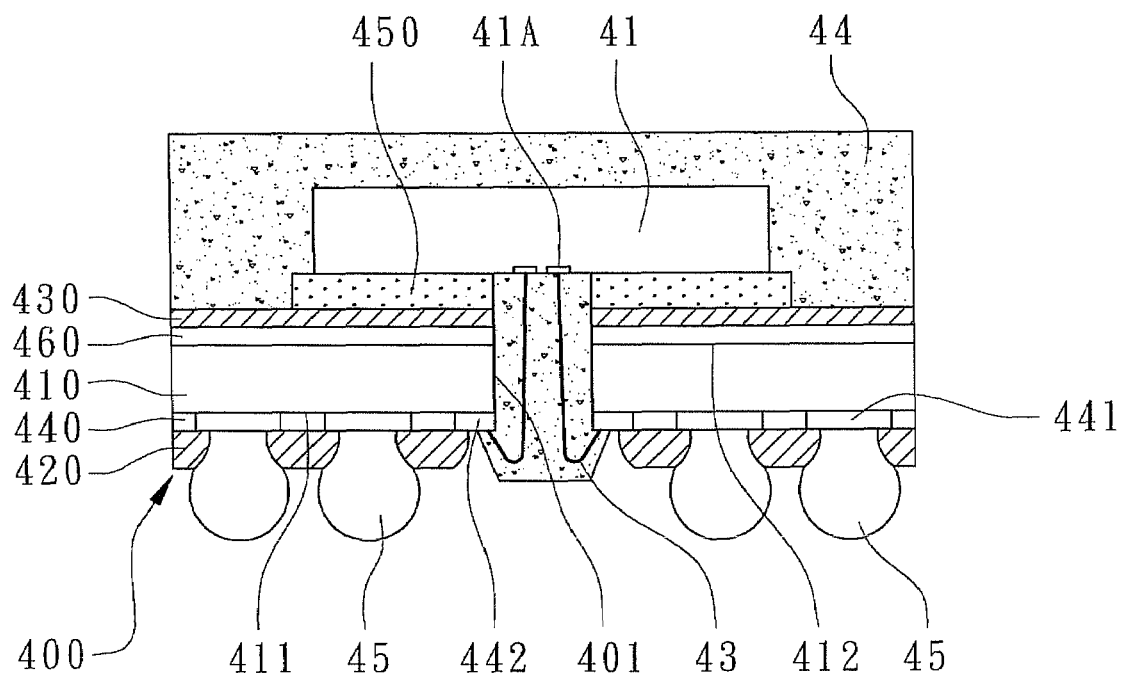
FIG. 6 shows a cross-sectional view of a semiconductor package using the substrate according to the third embodiment of the present invention.

In the following packaging processes, as shown in FIG. 6, a semiconductor chip 41 is disposed above the second surface 412 of the core 410 by the die-attaching layer 450 adhering the active surface of the semiconductor chip 41 to the second solder mask 430. The chip 41 has a plurality of bonding pads 41A disposed on the active surface. The bonding pads 41A of the chip 41 are electrically connected to the bonding fingers 442 of the substrate 400 by a plurality of electrical connecting components 43 passing through the through hole 401. In the present embodiment, the electrical connecting components 43 include a plurality of bonding wires formed by wire bonding. Then, an encapsulant 44 is formed over the top surface of the substrate 400 above the second surface 412 of the core 410, partially formed on the bottom surface of the substrate 400, and completely filled in the through hole 401 to encapsulate the chip 41 and the electrical connecting components 43 for better protections. A plurality of external terminals 45 such as solder balls are bonded to the external pads 441 to protrude from the first solder mask 420 for external electrical connections of the chip 41 to an external printed circuit board.

During substrate baking, molding compound curing, or thermal cycle tests, since the thickness difference between the first solder mask 420 and the second solder mask 430, the substrate warpage due to temperature differences will be under control and remain stable.

Finally, in the present invention, different thicknesses of solder masks are disposed on the top surface and on the bottom surface of the substrate to balance the thermal stresses due to temperature differences to control substrate warpage during semiconductor packaging processes. Therefore, the substrate can be manufactured in a lower cost without adding extra stiffeners to achieve substrate warpage control The above description of embodiments of this invention is intended to be illustrative and not limiting. Other embodiments of this invention will be obvious to those skilled in the art in view of the above disclosure.

What is claimed is:

1. A substrate comprising:
a core having a first surface and a second surface;
a first solder mask formed on the first surface of the core;
a second solder mask formed on the second surface of the core;
a first wiring layer formed on the first surface of the core and partially covered by the first solder mask; and
a die-attaching layer formed on the second solder mask;
wherein the first solder mask has a thickness difference with respect to the second solder mask in a manner to reduce the warpage of the substrate;
wherein the first solder mask is thinner than the second solder mask, and wherein the CTE of the die-attaching layer is smaller than the CTE of the first solder mask.

2. The substrate as claimed in claim 1, wherein the thickness difference between the first solder mask and the second solder mask is not less than 10 µm.

3. The Substrate as claimed in claim 1, further comprising a second wiring layer or a ground layer formed on the second surface of the core and covered by the second solder mask so that the substrate is laminated.

4. The substrate as claimed in claim 1, further comprising a through hole penetrating through the first solder mask, the core and the second solder mask.

5. The substrate as claimed in claim 1, wherein the first wiring layer includes a plurality of external pads exposed from the first solder mask.

6. The substrate as claimed in claim 1, wherein the die-attaching layer partially covers a central area of the second solder mask.

7. A semiconductor package comprising:
a substrate comprising:
a core having a first surface and a second surface;
a first solder mask formed on the first surface of the core;
a second solder mask formed on the second surface of the core;
a first wiring layer formed on the first surface of the core and partially covered by the first solder mask; and
a die-attaching layer formed on the second solder mask;
wherein the first solder mask has a thickness difference with respect to the second solder mask in a manner to reduce the warpage of the substrate;
wherein the first solder mask is thinner than the second solder mask, and wherein the CTE of the die-attaching layer is smaller than the CTE of the first solder mask;
a chip disposed on the second surface of the core by the die-attaching layer;
a plurality of electrical connecting components electrically connecting the chip to the first wiring layer of the substrate; and
an encapsulant disposed above the second surface of the core to encapsulate the chip.

8. The semiconductor package as claimed in claim 7, wherein the thickness difference between the first solder mask and the second solder mask is not less than 10 µm.

9. The semiconductor package as claimed in claim 7, wherein the substrate further comprises a second wiring layer or a ground layer formed on the second surface of the core and covered by the second solder mask so that the substrate is laminated.

10. The semiconductor package as claimed in claim 7, wherein the substrate further comprises a through hole penetrating through the first solder mask, the core, and the second solder mask.

11. The semiconductor package as claimed in claim 10, wherein the first wiring layer includes a plurality of external pads exposed from the first solder mask.

12. The semiconductor package as claimed in claim 11, further comprising a plurality of external terminals bonded to the external pads.

13. The semiconductor package as claimed in claim 12, wherein the external terminals include a plurality of solder balls.

14. The semiconductor package as claimed in claim 7, wherein the die-attaching layer partially covers a central area of the second solder mask, and the encapsulant covers the other area of the second solder mask.

15. A substrate comprising:
a core having a first surface and a second surface;
a first solder mask formed on the first surface of the core;
a second solder mask formed on the second surface of the core;
a first wiring layer formed on the first surface of the core and partially covered by the first solder mask; and
a die-attaching layer formed on the second solder mask;
wherein the first solder mask has a thickness difference with respect to the second solder mask in a manner to reduce the warpage of the substrate;
wherein the thickness of the first solder mask is larger than the thickness of the second solder mask;
wherein the CTE (Coefficient of Thermal Expansion) of the die-attaching layer is about the same as the CTE of the first solder mask.

16. A semiconductor package comprising:
a substrate comprising:
a core having a first surface and a second surface;
a first solder mask formed on the first surface of the core;
a second solder mask formed on the second surface of the core;
a first wiring layer formed on the first surface of the core and partially covered by the first solder mask; and
a die-attaching layer formed on the second solder mask;
wherein the first solder mask has a thickness difference with respect to the second solder mask in a manner to reduce the warpage of the substrate;
wherein the thickness of the first solder mask is larger than the thickness of the second solder mask;
wherein the CTE (Coefficient of Thermal Expansion) of the die-attaching layer is about the same as the CTE of the first solder mask;
a chip disposed on the second surface of the core by the die-attaching layer;
a plurality of electrical connecting components electrically connecting the chip to the first wiring layer of the substrate; and
an encapsulant disposed above the second surface of the core to encapsulate the chip.

* * * * *